United States Patent
Hong et al.

(10) Patent No.: US 9,059,156 B2
(45) Date of Patent: Jun. 16, 2015

(54) METHOD OF FORMING AN ERBIUM SILICIDE METAL GATE STACK FINFET DEVICE VIA A PHYSICAL VAPOR DEPOSITION NANOLAMINATE APPROACH

(71) Applicant: Intermolecular Inc., San Jose, CA (US)

(72) Inventors: Zhendong Hong, San Jose, CA (US); Ashish Bodke, San Jose, CA (US); Olov Karlsson, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 15 days.

(21) Appl. No.: 14/090,822

(22) Filed: Nov. 26, 2013

(65) Prior Publication Data

US 2015/0091105 A1    Apr. 2, 2015

Related U.S. Application Data

(60) Provisional application No. 61/884,339, filed on Sep. 30, 2013.

(51) Int. Cl.
| | |
|---|---|
| H01L 21/336 | (2006.01) |
| H01L 29/49 | (2006.01) |
| H01L 21/28 | (2006.01) |
| H01L 29/66 | (2006.01) |
| H01L 29/78 | (2006.01) |

(52) U.S. Cl.
CPC ...... *H01L 29/4975* (2013.01); *H01L 21/28097* (2013.01); *H01L 29/66477* (2013.01); *H01L 29/78* (2013.01)

(58) Field of Classification Search
CPC ............. H01L 21/823835; H01L 21/665; H01L 21/66515; H01L 21/28518
USPC ........... 438/581, 583, 630, 649, 651, 655, 438/644–645, 682, 721, 775
See application file for complete search history.

(56) References Cited

U.S. PATENT DOCUMENTS

| | | | |
|---|---|---|---|
| 6,077,779 A | 6/2000 | Shue et al. | |
| 7,378,356 B2 | 5/2008 | Zhang et al. | |
| 2001/0024847 A1* | 9/2001 | Snyder | 438/197 |
| 2004/0129975 A1* | 7/2004 | Koh et al. | 257/347 |
| 2007/0007579 A1* | 1/2007 | Scheuerlein et al. | 257/315 |
| 2010/0258868 A1* | 10/2010 | Yin et al. | 257/347 |
| 2015/0001610 A1* | 1/2015 | Zhang et al. | 257/324 |

OTHER PUBLICATIONS

Koh et al.; New Tellurium Implant and Segregation for Contact Resistance Reduction and Single Metallic Silicide Technology for Independent Contact Resistance Optimization in n and pFinFETs; Jan. 1, 2011; Globalfoundries, Inc.; Unknown.

Hoong-Shing Wong et al.; Novel Nickel Silicide Contact Technology Using Selenium Segregation for SOI NFETs with SiliconCarbon SourceDrain Stressors; Aug. 1, 2008; IEEE; Unknown.

\* cited by examiner

*Primary Examiner* — Dung Le (57) ABSTRACT

Methods to form metal gate transistor devices are disclosed. Erbium silicide layers can be used in CMOS transistors in which the work function of the erbium silicide layers can be tuned for use in PMOS and NMOS devices. A nanolaminate sputtering approach can be used in which silicon and erbium layers are alternatingly deposited to determine optimum layer properties, composition profiles, and erbium to silicon ratios for a particular gate stack.

20 Claims, 12 Drawing Sheets

METHOD OF FORMING AN ERBIUM SILICIDE METAL GATE STACK FINFET DEVICE VIA A PHYSICAL VAPOR DEPOSITION NANOLAMINATE APPROACH

CROSS-REFERENCE TO RELATED APPLICATIONS

This application claims priority to U.S. Prov. Pat. App. Ser. No. 61/884,339, filed 30 Sep. 2013, which is entirely incorporated by reference herein for all purposes.

FIELD

The present invention relates to methods to form a semiconductor device, and more particularly to methods to form devices having erbium silicide metal gate.

BACKGROUND

Advances in semiconductor processing have demanded ever-increasing high functional density with continuous size scaling. This scaling process has led to the adoption of high-k gate dielectrics and metal gate electrodes in metal gate stacks in semiconductor devices.

High-k gate dielectrics can offer a way to scale down the thickness of the gate dielectric with acceptable gate leakage current. The use of high-k gate dielectrics is often accompanied by a metal gate electrode, since thin gate dielectric layers may cause poly depletion, affecting the device operation and performance.

The introduction of metal elements to the device, e.g., in the formation of the metal gate electrode, can impose significant changes to the device fabrication process, including device structure designs to reduce leakage, process chemistry to pattern metallic structures and avoid metal corrosion, and cleaning chemistry to remove metallic-containing residues.

For complementary metal-oxide-semiconductor (CMOS) transistors with metal gates, it is desirable to fabricate PMOS and NMOS transistors having gates of different work functions. For example, current FinFET replacement metal gate integration scheme uses an Al-based metal gate for NMOS and a TiN-based metal gate for PMOS. Besides the fabrication complexity of using two different metals, Al-based metal gate can have high resistivity, poor thermal stability, and potentially requiring metal cladding.

Therefore, there is a need for methods to form metal gate transistors devices having similar process flows and/or a same metal in the metal gates with a first work function for a PMOS device and a second work function for an NMOS device.

SUMMARY OF THE DESCRIPTION

In some embodiments, methods, and devices fabricated from the methods, are provided to incorporate erbium silicide to a metal gate stack. Erbium silicide can exhibit different work function values, depending on the percentage of silicon. For example, work function tuning between 4.2 eV and 4.6 eV can be achieved with silicon percentage between 20 at % and 70 at % in the erbium silicide. The work function tuning capability of erbium silicide can allow the use of single materials in the metal gate stacks of NMOS and PMOS devices, simplifying the process flows and the facility requirements of semiconductor device fabrication. Further, high electrical conductivity of erbium silicide can eliminate the need for a gate electrode, as in the case of low conductivity gate metal layer.

In some embodiments, the erbium silicide layer can be formed using a nanolaminate process, such as a deposition sequence of multiple alternate layers of erbium and silicon, e.g., by physical vapor deposition or atomic layer deposition, followed by a high temperature anneal to complete the silicidation of erbium and silicon. Different compositions and composition profiles of the erbium silicide layer can be achieved by varying the individual layer thicknesses, e.g., by varying the process conditions (deposition time, deposition power, deposition pressure, etc.) or by varying the number of individual layers in each sequence. Desired characteristics of the metal gate stack, such as the work function optimization for NMOS and PMOS devices, can be achieved with different silicon and erbium ratios for the erbium silicide gate electrode layer.

In some embodiments, the erbium silicide layer can be optimized to have a composition gradient, such as lower erbium-silicon ratio at the interface of the erbium silicide layer with the gate dielectric layer, as compared to that at the top of the erbium silicide layer. The composition gradient can be a gradual gradient, having the composition ratio gradually changed. The composition gradient can be an abrupt gradient, having multiple distinct composition ratios across the gate electrode stack.

In some embodiments, the nanolaminate erbium silicide can be used in a gate stack for finFET devices. The erbium silicide layer can function as a matching work function layer, together with having excellent thermal stability and high conductivity as a gate electrode.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, an erbium silicide layer is disclosed for used as a gate electrode in transistor devices. The work function of erbium silicide can be tuned for use in PMOS and/or NMOS devices. In addition, the conductivity of erbium silicide can be adequate to eliminate the need for a gate conductor, allowing single layer gate stack configurations. Further, erbium silicide can be deposited in nanolaminates of erbium and silicon, achieving gradient composition profiles to optimize device performances, such as low gate leakage and high gate conductivity. In some embodiments, semiconductor devices and integrated circuits utilizing erbium silicide layers in the gate stack are provided.

Figure 1A:
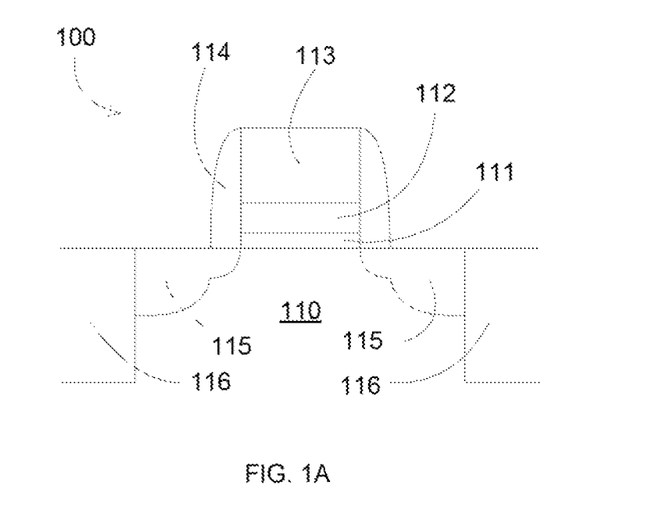
FIGS. 1A-1B illustrate semiconductor device configurations according to some embodiments.
Figure 1B:
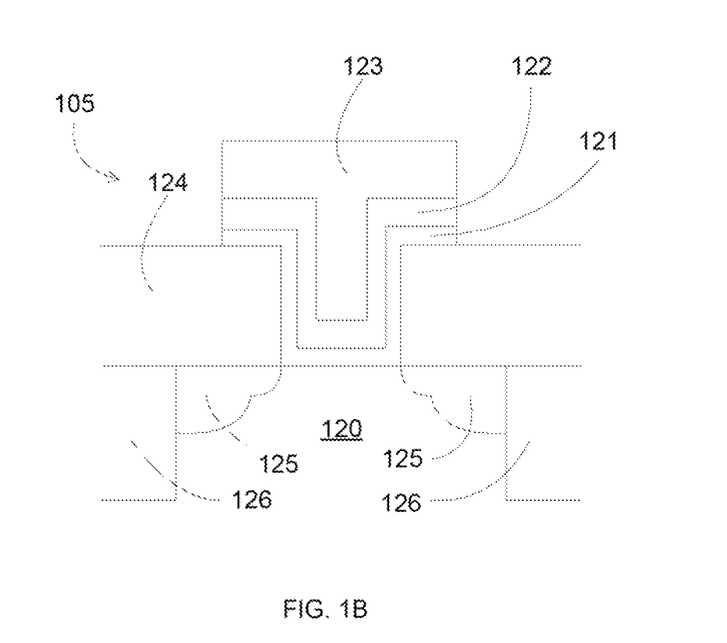

FIGS. 1A-1B illustrate semiconductor device configurations according to some embodiments. In FIG. 1A, a transistor structure 100 is formed on a substrate 110. A gate stack can be fabricated on the substrate 110, including a gate dielectric layer 111, a gate layer 112 over the gate dielectric layer 111, and a gate conductor layer 113 over the gate layer 112. The gate conductor 113 can include high conduction materials, such as tungsten or aluminum, to improve the conduction of the gate stack. The device 100 is isolated from other devices by isolation regions 116. The device 100 also includes spacers 114 and source and drain regions 115.

FIG. 1B shows a replacement gate configuration for a transistor device. The device 105 can be fabricated on a substrate 120, including a gate dielectric layer 121, a gate layer 122 over the gate dielectric layer 121, and a gate conductor layer 123 over the gate layer 122. The gate structure can be fabricated in an opening of a protective layer 124.

Complementary Metal Oxide Semiconductor (CMOS) devices include pairs of n-channel (NMOS) and p-channel (PMOS) transistor structures. One of the controlling physical characteristics of the transistor structures is the work function of the material used to form the gate electrodes, which can determine the threshold voltage of the transistors. For example, a PMOS transistor can be optimized with about 5 eV work function of the gate electrode. An NMOS transistor can be optimized with about 4 eV work function of the gate electrode.

The work function of a metal is closely related to its Fermi energy. For example, the intrinsic Fermi level of an undoped semiconductor is at the middle of the band gap between the conduction and valence band edges. In an n-doped silicon, the Fermi level is closer to the conduction band than to the valence band (e.g., about 4.15 electron-volts). Thus an NMOS transistor can include an n-doped gate layer. In a p-doped silicon, the Fermi level is closer to the valence band than the conduction band (e.g., about 5.2 electron-volts). Thus a PMOS transistor can include a p-doped gate layer.

Advances in integrated circuit technology require device size reduction with improved performance. A potential issue in device scaling is the polysilicon gate layer overlying the thin gate dielectric layer. Polysilicon can exhibit a depletion region at the interface between the polysilicon gate and the gate dielectric. The depletion region can be considered as a 0.3 nm thick insulator and, thus can increase the gate dielectric layer by a same amount. This equivalent thickness increase can significantly limit the benefits of thin gate dielectric. Metal gate layers do not exhibit the depletion region phenomenon, and thus metal gate devices have been considered in advanced semiconductor devices.

To replace p-type or n-type polysilicon gate layers with metal layers, metals with similar work function characteristics may need to be used to achieve comparable transistor threshold voltages. Examples of metals that have a work function similar to p-doped semiconductor material include titanium nitride and tantalum nitride (TaN). Examples of metals that have a work function similar to n-doped semiconductor material include aluminum and tantalum.

Figure 2:
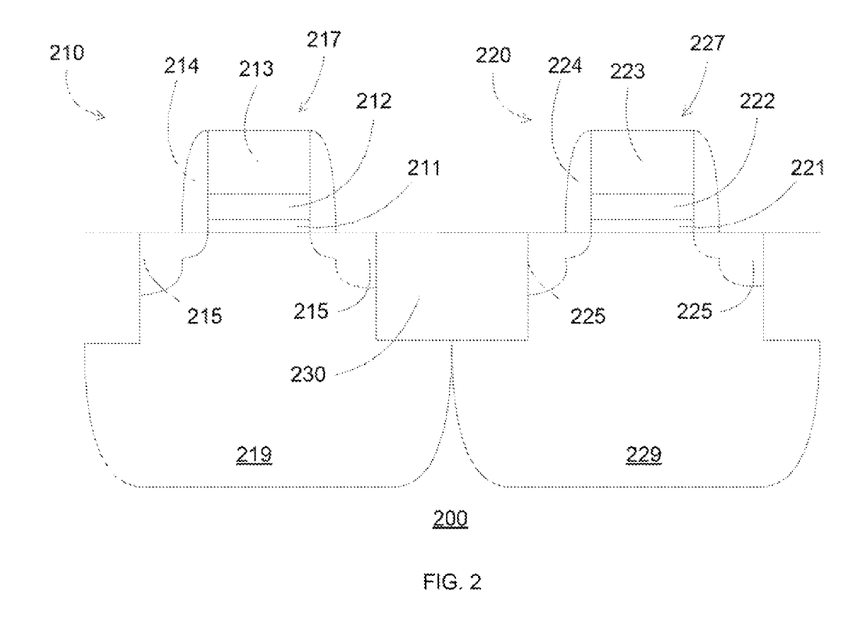
FIG. 2 illustrates a complementary pair of transistor structures according to some embodiments.

FIG. 2 illustrates a complementary pair of transistor structures according to some embodiments. NMOS device 210 and PMOS device 220 can be formed on a substrate 200, using gate stacks 217 and 227 over active area in P-type well 219 and N-type well 229, respectively. NMOS device 210 and PMOS device 220 can be isolated by isolation region 230.

NMOS device 210 can include the gate stack 217 between source and drain 215, with spacer 214. The source and drain regions 215 can be implanted with an n-type conductivity to form an n-channel or NMOS transistor. The gate stack 217 can include a gate dielectric 211, a gate layer 212, and a gate conductor 213. The gate layer 212 is configured to match work function with the n-channel, such as an n-doped polysilicon or a material having work function in the order of 4 eV. The gate conductor 213 can be used to increase the electrical conductivity for the gate stack 217.

PMOS device 220 can include the gate stack 227 between source and drain 225, with spacer 224. The source and drain regions 225 can be implanted with a p-type conductivity to form a p-channel or PMOS transistor. The gate stack 227 can include a gate dielectric 221, a gate layer 222, and a gate conductor 223. The gate layer 222 is configured to match work function with p-channel, such as a p-doped polysilicon or a material having work function in the order of 5 eV. The gate conductor 223 can be used to increase the electrical conductivity for the gate stack 227.

In some embodiments, methods, and devices fabricated from the methods, are provided to incorporate erbium silicide to a metal gate stack. Erbium silicide can exhibit different work function values depending on the percentage of silicon. For example, work function tuning between 4.2 eV and 4.6 eV can be achieved with silicon percentages between 20 at % and 70 at % in the erbium silicide. The work function tuning capability of erbium silicide can allow the use of single materials in the metal gate stacks of NMOS and PMOS devices, simplifying the process flows and the facility requirements of semiconductor device fabrication.

Further, high electrical conductivity of erbium silicide can eliminate the need for a gate conductor, as in the case of low conductivity gate metal layer. The single conducting gate electrode can be used to meet the need of advanced device scaling. For advanced technology nodes, the total thickness of metal gate and fill metal can be required to be less than 5 nm for a gate length less than 20 nm, so a single layer metal gate structure that can have tunable work function value to work either as a NMOS or a PMOS device can be advantageous.

Figure 3A:
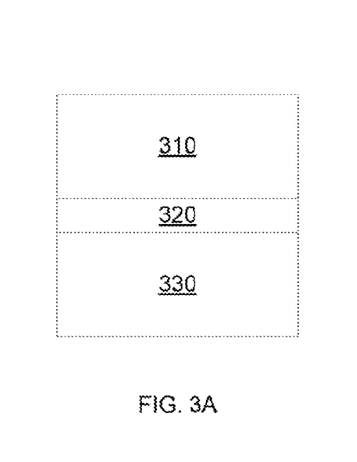
FIGS. 3A-3B illustrate schematic representation of transistor devices incorporating erbium silicide in a gate stack according to some embodiments.
Figure 3B:
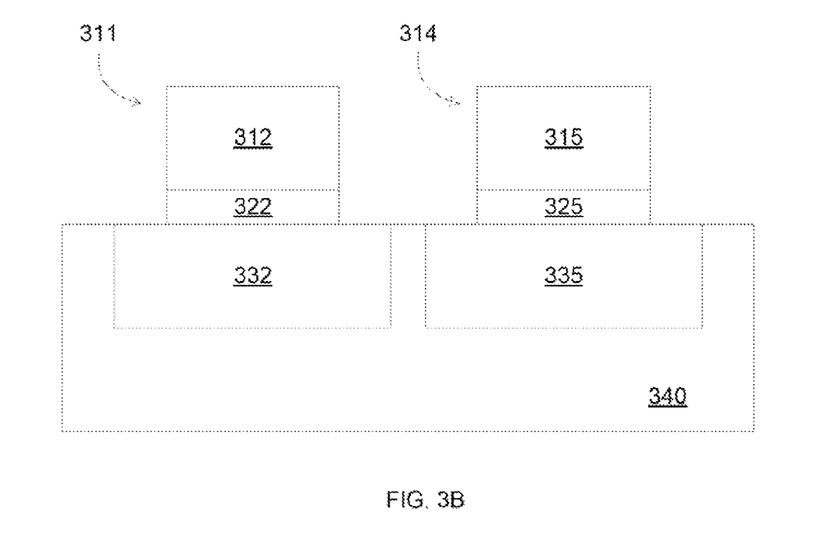

FIGS. 3A-3B illustrate schematic representations of transistor devices incorporating erbium silicide in a gate stack according to some embodiments. In FIG. 3A, a transistor device having an erbium silicide layer 310 is disposed on a dielectric layer 320, such as a high dielectric constant layer, on a substrate 330, such as a silicon substrate. In FIG. 3B, CMOS devices including NMOS 311 and PMOS 314 are fabricated on a substrate 340. NMOS 311 can include a single layer gate stack 312 including erbium silicide, which is disposed on a dielectric layer 322, which is disposed on a p-well 332. PMOS 314 can include a single layer gate stack 315 including erbium silicide, which is disposed on a dielectric layer 325, which is disposed on a p-well 335. The erbium silicide compositions in gate stacks 312 and 315 can have different silicon composition, with the individual silicon compositions vary to change the work function of the gate stack 312 and 315 to match with the characteristics, e.g., threshold voltage, of the corresponding NMOS and PMOS devices 311 and 314.

Figure 4A:
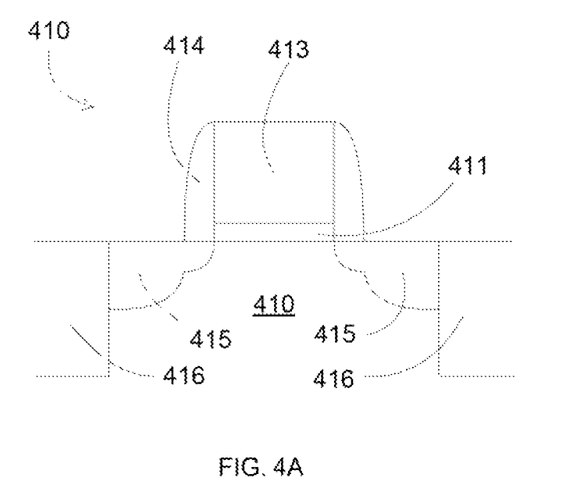
FIGS. 4A-4B illustrate semiconductor device configurations incorporating erbium silicide in gate stacks according to some embodiments.

FIGS. 4A-4B illustrate semiconductor device configurations incorporating erbium silicide in gate stacks according to some embodiments. In FIG. 4A, a transistor structure 400 is formed on a substrate 410, which can be single crystal silicon, although other substrates can be used, such as glass substrates, silicon-germanium substrates, or GaAs substrates. A gate stack can be fabricated on the substrate 410, including a gate dielectric layer 411, a gate layer 413 over the gate dielectric layer 411. The gate layer 413 can include erbium silicide, with a silicon concentration optimized to achieve a desired work function, for example, to achieve a threshold voltage for the transistor device. The erbium silicide can have high conductivity, thus can also function as a gate conductor, eliminating the need for a separate gate conductor. The device 410 is isolated from other devices by isolation regions 416, such as shallow trench isolation or local oxidation of silicon (LOCOS) isolation. The device 410 also includes spacers 414 and source and drain regions 415. FIG. 4A shows a metal-oxide-semiconductor field effect transistor (MOSFET) structure 400, but the invention is not so limited, and can include any transistor structure, such as bipolar transistors, fin transistors or double gate transistors. Further, silicide layers can be included, such as $TiSi_2$, $CoSi_2$, NiSi, or NiPtSi, for the source and drain regions 415, which can form low contact resistance with the source and drain regions. Other components can be included, such as n or p well regions, depending on the type of the semiconductor devices. For example, NMOS devices can be fabricated directly on a p-type substrate, and PMOS devices can be fabricated in an n-well on the p-type substrate. For n-type substrate, NMOS devices can be fabricated in a p-well, while PMOS devices can be fabricated directly on the n-type substrate. Alternatively, for a twin well process, NMOS devices can be fabricated in a p-well, while PMOS devices can be fabricated in a n-well, with both n-well and p-well formed in the substrate. The transistor device 400 can be incorporated in integrated circuits, further comprising interconnects for connecting multiples devices.

Figure 4B:
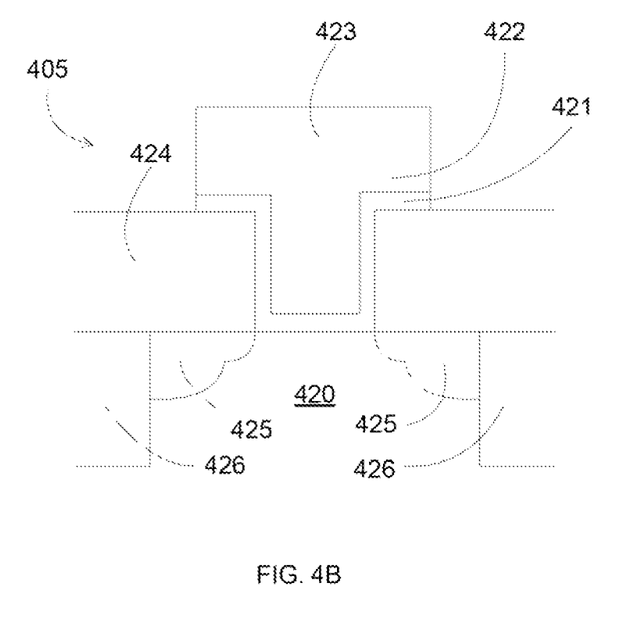

FIG. 4B shows a replacement gate configuration for a transistor device. The device 405 can be fabricated on a substrate 420, including a gate dielectric layer 421, a gate layer 422 over the gate dielectric layer 421. The gate layer 413 can include erbium silicide, with a silicon concentration optimized to achieve a desired work function, for example, to achieve a threshold voltage for the transistor device. The erbium silicide can have high conductivity, thus can also function as a gate conductor. The gate structure can be fabricated in an opening of a protective layer 424. There can be silicide regions (not shown) on the gate conductor layer 423 for improving contact resistance. The device shown is an exemplary planar device configuration, and other device configurations are also within the scope of the present invention, such as tri-gate transistor configurations, fin-FET configurations, or different types of transistors or devices. The metal gate device 420 can be incorporated in integrated circuits, further comprising interconnects for connecting multiples devices.

In some embodiments, the nanolaminate erbium silicide can be used in a gate stack for finFET devices. The erbium silicide layer can functioned as a matching work function layer, together with having excellent thermal stability and high conductivity as a gate electrode.

Figure 5:
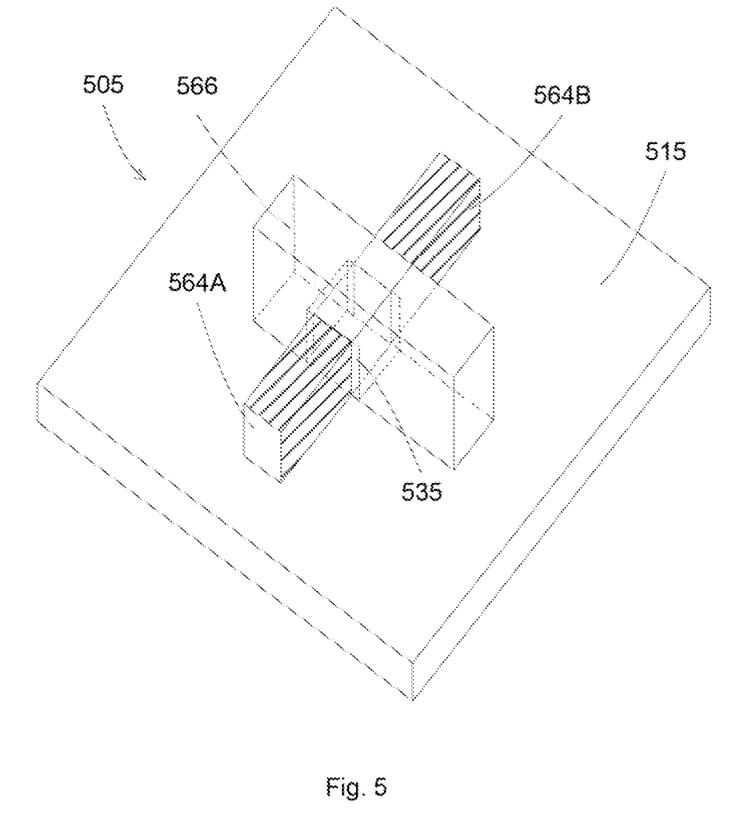
FIG. 5 illustrates an example of a finFET device according to some embodiments.

FIG. 5 illustrates an example of a finFET device according to some embodiments. A finFET device 505 having a semiconductor body having a fin shape formed on a substrate 515. Source/drain regions 564A/564B can be formed at opposite ends of the semiconductor body. A gate dielectric 535 can be formed on a portion between the source and drain regions, which becomes a channel region of the finFET device. The gate dielectric 535 can include a high dielectric constant material, such as $TiO_2$. A gate layer 566 can be formed on the gate dielectric 525. The gate layer 566 can include erbium silicide, with a silicon concentration optimized to achieve a desired work function, for example, to achieve a threshold voltage for the transistor device. The erbium silicide can have high conductivity, thus can also function as a gate conductor. The source/drain regions can be doped, for example, with p-type or n-type dopants to form p-type or n-type devices. The doping of the source/drain regions can be accomplished by doping the whole semiconductor body, using the gate electrode to act as a mask to prevent the channel region from being doped. As shown, the gate dielectric and the gate electrode surround the channel on two sides, forming a double-gate finFET device.

Figure 6:
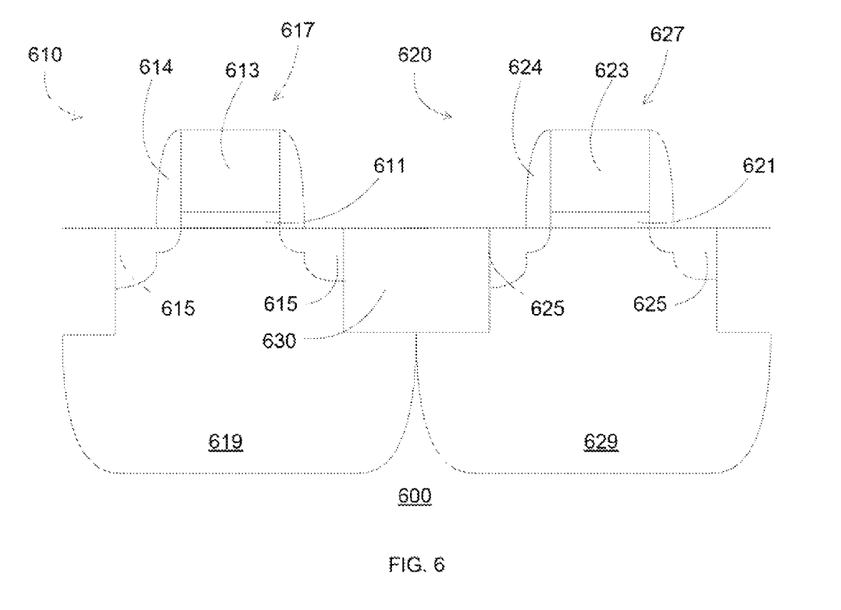
FIG. 6 illustrates a complementary pair of transistor structures incorporating erbium silicide according to some embodiments.

FIG. 6 illustrates a complementary pair of transistor structures incorporating erbium silicide according to some embodiments. NMOS device 610 and PMOS device 620 can be formed on a substrate 600, using gate stacks 617 and 627 over actives area in P-type well 619 and N-type well 629, respectively. NMOS device 610 and PMOS device 620 can be isolated by isolation region 630.

NMOS device 610 can include the gate stack 617 between source and drain 615, with spacer 614. The source and drain regions 615 can be implanted with an n-type conductivity to form an n-channel or NMOS transistor. The gate stack 617 can include a gate dielectric 611, and a gate layer 613. The gate layer 613 can include erbium silicide with a silicon concentration configured to match work function with the n-channel. The erbium silicide in the gate layer 613 can provide a high electrical conductivity for the gate stack 617, thus can eliminate the need for a separate gate conductor layer.

PMOS device 620 can include the gate stack 627 between source and drain 625, with spacer 624. The source and drain regions 625 can be implanted with a p-type conductivity to form a p-channel or PMOS transistor. The gate stack 627 can include a gate dielectric 621, and a gate layer 623. The gate layer 623 can include erbium silicide with a silicon concentration configured to match work function with p-channel, such as a p-doped polysilicon or a material having work function in the order of 5 eV. The gate conductor 623 can provide a high electrical conductivity for the gate stack 617, thus can eliminate the need for a separate gate conductor layer.

In some embodiments, methods, and devices fabricated from the methods, are provided to form metal gate stacks including an erbium silicide layer with different silicon concentration on a gate dielectric layer. The erbium silicide layer with different silicon concentration can be formed using a nanolaminate process, such as a deposition sequence of multiple alternate layers of erbium and silicon, e.g., by physical vapor deposition, followed by a high temperature anneal to complete the silicidation of erbium and silicon. Different compositions and composition profiles of the erbium silicide layer can be achieved by varying the individual layer thicknesses, e.g., by varying the process conditions (deposition time, deposition power, deposition pressure, etc.) or by varying the number of individual layers in each sequence. Desired characteristics of the metal gate stack, such as the work function optimization for NMOS and PMOS devices, can be achieved with different silicon and erbium ratios for the erbium silicide gate electrode layer.

Figure 7A:
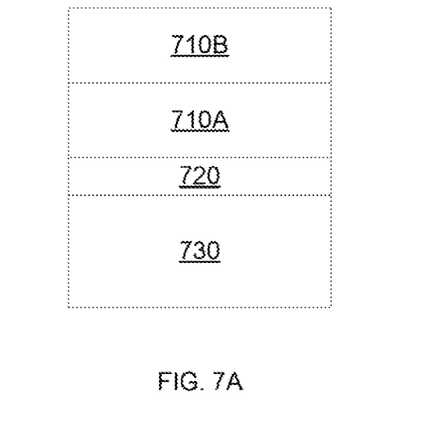
FIGS. 7A-7B illustrate an process sequence of forming a gate electrode having erbium silicide according to some embodiments.

FIGS. 7A-7B illustrate an process sequence of forming a gate electrode having erbium silicide according to some embodiments. In FIG. 7A, a layer of erbium 710B is formed on a layer of silicon 710A, which is formed on a layer of dielectric material 720, such as a high dielectric constant layer. The layer stack can be formed on a substrate 730, such as a silicon substrate.

Figure 7B:
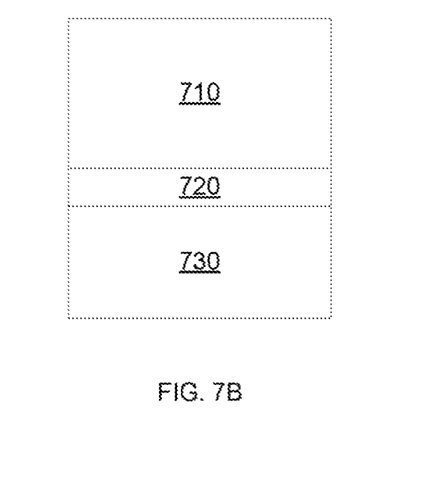

In FIG. 7B, the substrate is annealed to react erbium in layer 710B with silicon in layer 710A to form a layer of erbium silicide 710, which is on the dielectric layer 720 on the substrate 730.

Different process conditions can be used to deposit a same amount of erbium and silicon, thus an alternate deposition sequence of erbium and silicon can include a 2 seconds direct current (DC) deposition of erbium at 50 W power and 5 milliTorr pressure, followed by a 5 seconds radio frequency (RF) deposition of silicon at 100 W power and 5 milliTorr pressure. The targets for these power ratings may be 2-3" in diameter, but larger or smaller targets may also be used at power densities of 1-2.5 W/cm$^2$ for the erbium and 2-5 W/cm$^2$ for the silicon. The deposition time for each layer can be adjusted proportionally, for example, a 4 second deposition of erbium followed by a 10 second deposition of silicon can provide a same ratio of erbium and silicon, with the individual layer thicknesses doubled. Alternatively, a deposition sequence of two erbium layers at 2 second each flowed by a silicon layer at 5 second can halve the ratio of silicon and erbium in the nanolaminate stack. The nanolaminate stack can subsequently be annealed for complete silicidation, suitable as metal gate. Alternatively any furnace anneals, rapid thermal processing (RTP) or high temperature depositions subsequent to the formation of the nanolamitate stack may be sufficient to form silicide by reaction between metal and silicon.

In addition, each layer in the nanolaminate stack can be independently tuned to optimize film properties, such as process pressure, deposition temperature, wafer bias etc. The independent tuning process, e.g., separate deposition process conditions for each layer in the nanolaminate stack, can allow the optimization of both erbium and silicon, which might not be available for co-deposition processes.

Further, nanolaminate stack deposition processes can reduce the fabrication cost in a semiconductor facility. For example, two targets of erbium and silicon can practically provide a large range of erbium-silicon compositions, either in a deposition system utilizing two targets or two separate deposition systems with each deposition system utilizing one target.

Figure 8A:
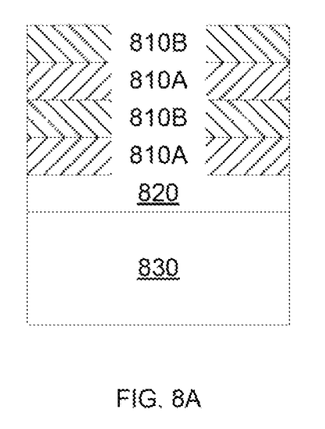
FIGS. 8A-8D illustrate different nanolaminate configurations of erbium and silicon according to some embodiments.
Figure 8B:
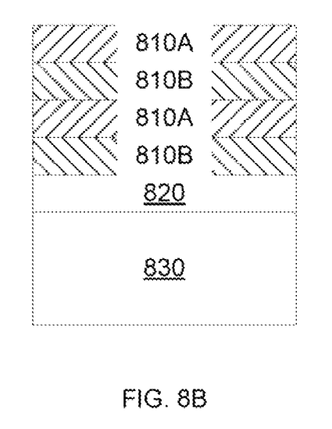
Figure 8C:
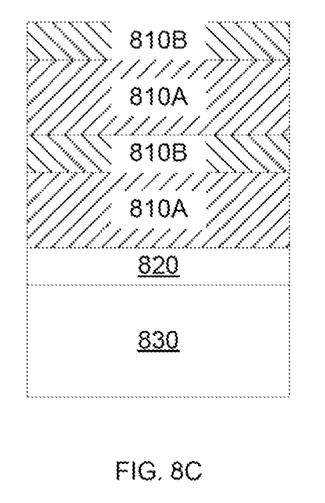
Figure 8D:
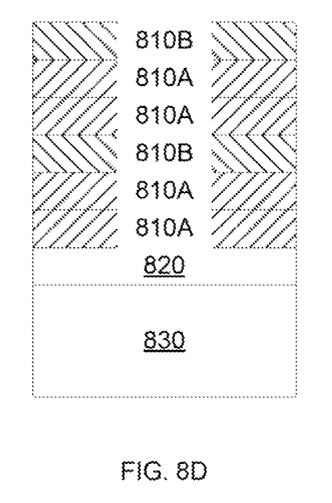

FIGS. 8A-8D illustrate different nanolaminate configurations of erbium and silicon according to some embodiments. A dielectric layer 820 can be formed on a substrate 830. Alternate layers of silicon 810A and erbium 810B can be formed on the dielectric layer 820. Different configurations of silicon and erbium layers can be used. For example, silicon layer 810A can be deposited first next to the dielectric layer 820 before depositing the erbium layer 810B (FIGS. 8A, 8C, and 8D), or erbium layer 810B can be deposited before silicon layer 810A (FIG. 8B). A silicon layer 810A can be followed by a layer of erbium 810B (FIGS. 8A, 8B, and 8C), or multiple silicon layers 810A can be followed by an erbium layer 810B (FIG. 8D). Similar thicknesses can be used for silicon layers 810A and erbium layer 810B (FIGS. 8A, 8B, and 8D), or different thicknesses can be used (FIG. 8C).

In some embodiments, erbium silicide can include silicon and erbium, e.g., ErSi$_x$, with x typically between 0 and 2. For example, erbium silicide can be ErSi$_{0.25}$ or Er$_4$Si. Erbium silicide can be ErSi$_2$.

The number of erbium atoms in a layer having thickness t and area A can be calculated from the density of erbium d$_{Er}$ and molecular weight of erbium m$_{Er}$, with N being the Avogadro number $$n_{Er} = \frac{t \times A \times d_{Er} \times N}{m_{Er}} \quad (1)$$

Similarly, the number of silicon atoms in a layer having thickness t and area A can be calculated from the density of silicon d$_{Si}$ and molecular weight of silicon m$_{Si}$ $$n_{Si} = \frac{t \times A \times d_{Si} \times N}{m_{Si}} \quad (2)$$

Thus Er$_4$Si can be achieved by an alternating sequence of 5.84 nm of erbium and 0.96 nm of silicon. Similarly, ErSi$_2$ can be achieved by an alternating sequence of 3.12 nm of erbium and 4.16 nm of silicon.

In some embodiments, the erbium silicide layer can be alternatingly sputtered from different elemental targets onto the same substrate. The process may be in Ar.

Figure 9:
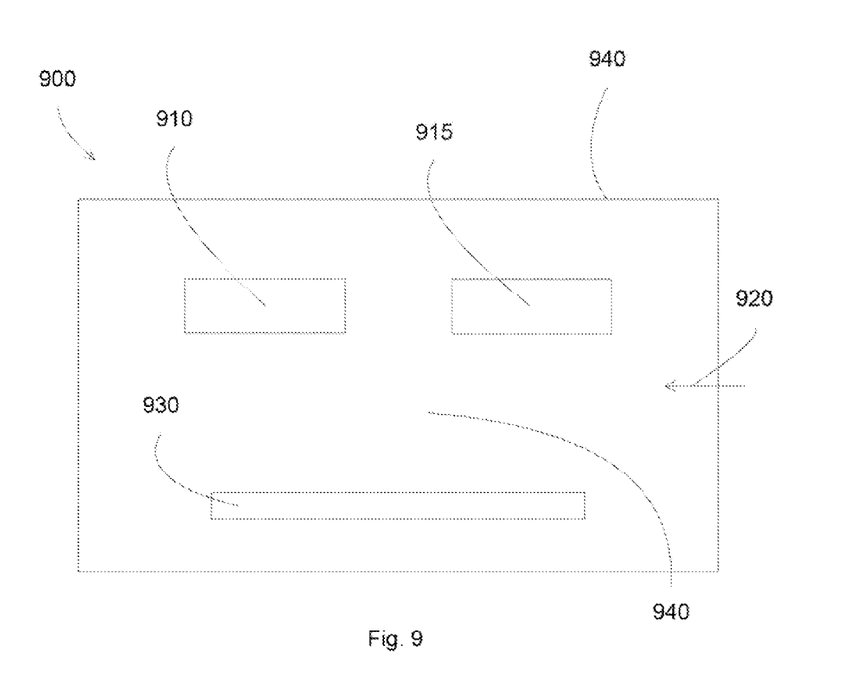
FIG. 9 illustrates a physical vapor deposition (PVD) system according to some embodiments.

FIG. 9 illustrates a physical vapor deposition (PVD) system according to some embodiments. A PVD system, also commonly called sputter system or sputter deposition system, 900 includes a housing that defines, or encloses, a processing chamber 940, a substrate 930, two targets 910 and 915, and reactive species delivered from an outside source via gas inlet 920. During deposition, the target is bombarded with argon ions, which releases sputtered particles toward the substrate 930. The sputter system 900 can perform blanket deposition on the substrate 930, forming a deposited layer that covers the whole substrate, e.g., the area of the substrate that can be reached by the sputtered particles generated from the targets. The targets 910 and 915 can include silicon and erbium, respectively.

The sputter deposition system 900 can include other components, such as a substrate support for supporting the substrate. The substrate support can include a vacuum chuck, electrostatic chuck, or other known mechanisms. The substrate support can be capable of rotating around an axis thereof that is perpendicular to the surface of the substrate. In addition, the substrate support may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

In some embodiments, the substrate support includes an electrode which is connected to a power supply, for example, to provide a RF or DC bias to the substrate, or to provide a plasma environment in the process housing 940. The one or both of targets 910 and 915 can include an electrode which is connected to a power supply to generate a plasma in the process housing. Targets 910 and 915 are preferably oriented towards the substrate 930.

The sputter deposition system 900 can also include a power supply coupled to one or two of the electrodes. The power supply provides power to the one or two electrodes, causing material to be, at least in some embodiments, sputtered from the targets. During sputtering, inert gases, such as argon or krypton, may be introduced into the processing chamber 940 through the gas inlet 920. In embodiments in which reactive sputtering is used, reactive gases may also be introduced, such as oxygen and/or nitrogen, which interact with particles ejected from the targets to form oxides, nitrides, and/or oxynitrides on the substrate.

The sputter deposition system 900 can also include a control system (not shown) having, for example, a processor and a memory, which is in operable communication with the other components and configured to control the operation thereof in order to perform the methods described herein.

In some embodiments, the interface at the erbium silicide and the gate dielectric can be optimized, for example, to minimize damage to the gate dielectric during the first deposition layer of the nanolaminate sequence or to improve the performance of the metal gate stack. For example, since erbium can be deposited using a DC sputtering process, which can generate plasma damage to the gate dielectric during first few deposition cycles, the nanolaminate deposition sequence can start with the RF silicon sputter deposition process. Further, the thickness or the number of silicon deposition layers at the interface can be optimized to reduce the plasma damage. For example, the thickness of the first silicon layer can be higher than subsequent silicon layer, or multiple silicon layers can be deposited, e.g., to shield the gate dielectric from the subsequent erbium process conditions. To achieve a desired composition erbium-silicon ratio, the deposition of the subsequent erbium layers can be adjusted accordingly. Due to the mild nature of the RF silicon deposition process, there can be minimal impact of the erbium silicide formation to underlying high-k dielectrics.

In some embodiments, the nanolaminate deposition process can suppress the gate leakage, e.g., as compared to co-deposition of erbium and silicon, for identical gate stacks involving erbium silicide work function tuning layer.

In some embodiments, the erbium silicide layer can be optimized to have a composition gradient, such as lower erbium-silicon ratio at the interface of the erbium silicide layer with the gate dielectric layer, as compared to that at the top of the erbium silicide layer. The composition gradient can be a gradual gradient, having the composition ratio gradually changed. The composition gradient can be an abrupt gradient, having multiple distinct composition ratios across the gate electrode stack.

In some embodiments, the composition gradient of the erbium silicide layer can allow optimization decoupling of several device requirements. For example, the bottom portion of the erbium silicide layer, e.g., near the gate dielectric layer, can be optimized for work function matching. The top portion of the erbium silicide layer can be optimized for other properties, such as conductivity, surface roughness, and porosity.

In some embodiments, the composition gradient of the erbium silicide layer can be achieved by varying the nanolaminate deposition conditions, for example, by changing the relative thicknesses of the individual erbium and silicon layers.

Figure 10A:
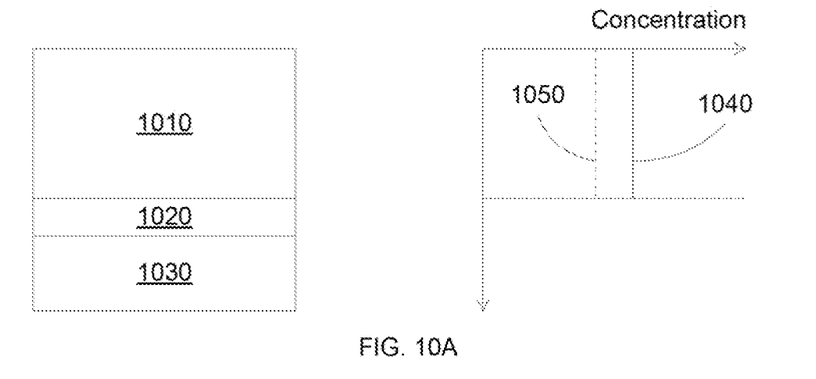
FIGS. 10A-10C illustrate different composition profiles for erbium silicide layers according to some embodiments.

FIGS. 10A-10C illustrate different composition profiles for erbium silicide layers according to some embodiments. In FIG. 10A, an erbium silicide layer 1010 is formed on a high dielectric constant layer 1020, such as a $HfO_2$ layer, which is formed on a substrate 1030. The erbium silicide layer 1010 can have constant concentration profiles throughout the layer, such as a constant erbium profile 1050 and a constant silicon profile 1040. As shown, the concentration of silicon 1040 is higher than the concentration of erbium 1050, signifying an erbium silicide of $ErSi_x$ with x greater than 1. Other silicon-erbium ration can also be used, for example, with x between 0 and 2.

Figure 10B:
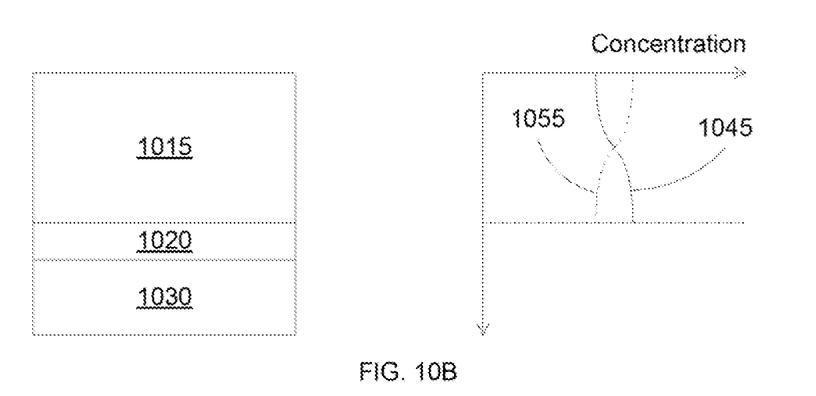

In FIG. 10B, an erbium silicide layer 1015 is formed on a high dielectric constant layer 1020, which is formed on a substrate 1030. The erbium silicide layer 1015 can have gradual concentration profiles, such as a silicon profile 1045 having high silicon concentration at the silicide 1015/dielectric 1020 interface, and an erbium profile 1055 having low erbium concentration at the silicide 1015/dielectric 1020 interface.

Figure 10C:
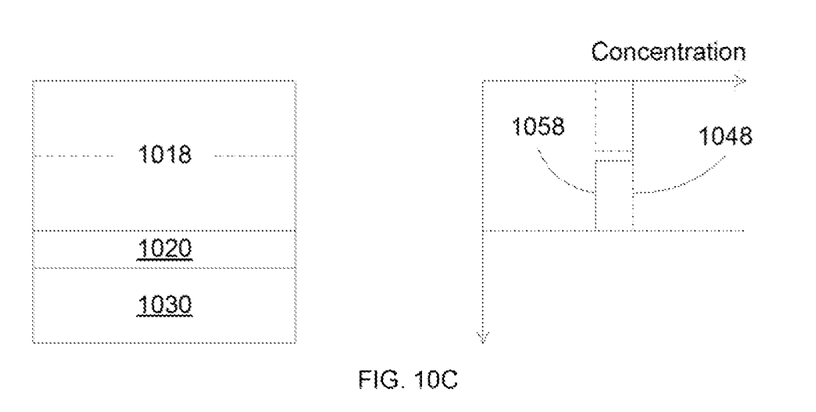

In FIG. 10C, an erbium silicide layer 1018 is formed on a high dielectric constant layer 1020, which is formed on a substrate 1030. The erbium silicide layer 1018 can have abrupt concentration profiles, such as a silicon profile 1048 having high silicon concentration at the silicide 1018/dielectric 1020 interface, and an erbium profile 1058 having low erbium concentration at the silicide 1018/dielectric 1020 interface.

In some embodiments, methods to form gate stack including erbium silicide layer are disclosed. The erbium silicide layer can be formed by nanolaminate deposition process, which can allow varying the concentration profile of erbium and silicon throughout the erbium silicide layer.

Figure 11:
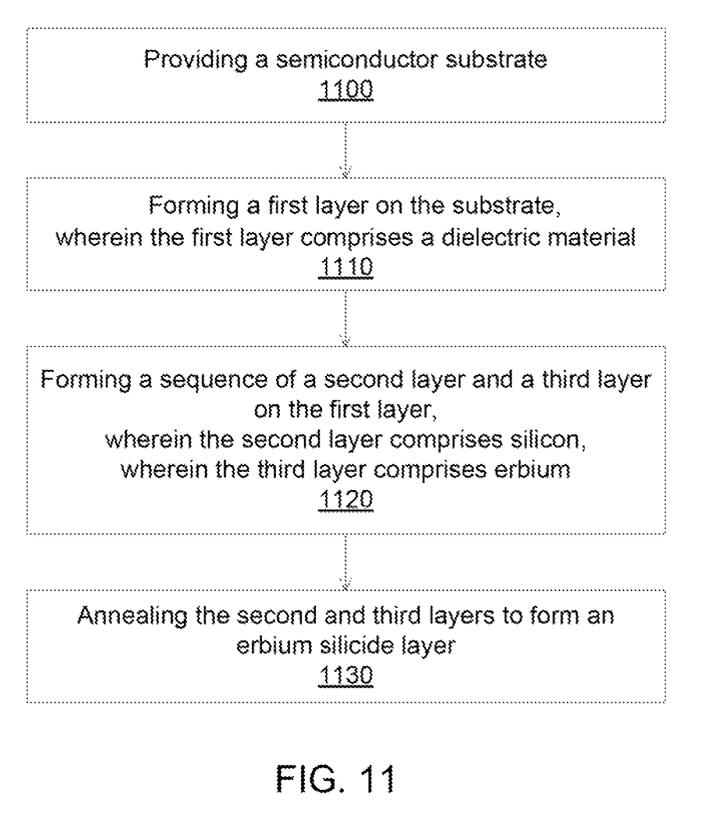
FIG. 11 illustrates a flow chart for forming an erbium silicide layer according to some embodiments.

FIG. 11 illustrates a flow chart for forming an erbium silicide layer according to some embodiments. After forming a dielectric layer on a substrate, such as a high dielectric constant dielectric layer, a sequence of silicon and erbium layers can be deposited on the dielectric layer. The substrate then can be annealed to form an erbium silicide layer.

In operation 1100, a substrate is provided. The substrate can be a semiconductor substrate, such as a silicon substrate, a germanium substrate, or a silicon-germanium substrate. Other substrates can also be used, such as a GaAs substrate, or a substrate having a semiconductor layer formed thereon.

In operation 1110, a dielectric layer can be formed on the substrate. The dielectric layer can include a high dielectric constant material, such as $HfO_2$, $HfSi_xO_y$, $Al_2O_3$, or $ZrO_2$. The thickness of the dielectric layer can be less than or equal to about 10 nm, or can be less than or equal to about 5 nm.

In operation 1120, an alternate sequence of silicon layers and erbium layers is formed on the dielectric layer. The total thickness of the sequence can be less than 10 nm or less than 5 nm. Different sequences can be used. For example, the sequence can include one or more silicon layers and one or more erbium layers. The sequence can include one silicon layer and one erbium layer. The sequence can include multiple silicon layers and one erbium layer. The sequence can include one silicon layer and multiple erbium layers.

In some embodiments, the sequence can include depositing the silicon layer before depositing the erbium layer. The sequence can include depositing the erbium layer before depositing the silicon layer.

In some embodiments, the silicon and erbium layers can be deposited using a physical vapor deposition process. The erbium layer can be deposited using a physical vapor deposition using a direct current sputtering process at 50 W. The silicon layer can be formed using a physical vapor deposition using a radio frequency sputtering process at 50 W. Alternatively the silicon and erbium layers can be deposited using an atomic layer deposition process.

In operation 1130, the substrate is annealed so that erbium and silicon in the alternate sequence can react to form an erbium silicide layer. Other processes can be included, for example, source and drain regions can be formed on the substrate before forming the first layer. Metal interconnect can be formed after forming the erbium silicide layer.

In some embodiments, methods to form gate stack including erbium silicide layer having a gradient composition are disclosed. The erbium silicide layer can be formed by nanolaminate deposition process, which can allow varying the concentration profile of erbium and silicon throughout the erbium silicide layer.

The methods can include providing a substrate; depositing a first layer on the substrate, wherein the first layer includes a dielectric material; depositing a second layer on the first layer, wherein the second layer includes erbium silicide, wherein the second layer includes a gradient of composition ratio of erbium and silicon. The erbium silicide layer can be deposited using a nanolaminate sequence of silicon and erbium layers.

In some embodiments, methods to form CMOS devices using gate stacks including erbium silicide layer having a different work function, e.g., through different silicon concentration, are disclosed. The erbium silicide layer can be formed by nanolaminate deposition process, which can allow varying the concentration profile of erbium and silicon throughout the erbium silicide layer.

Figure 12:
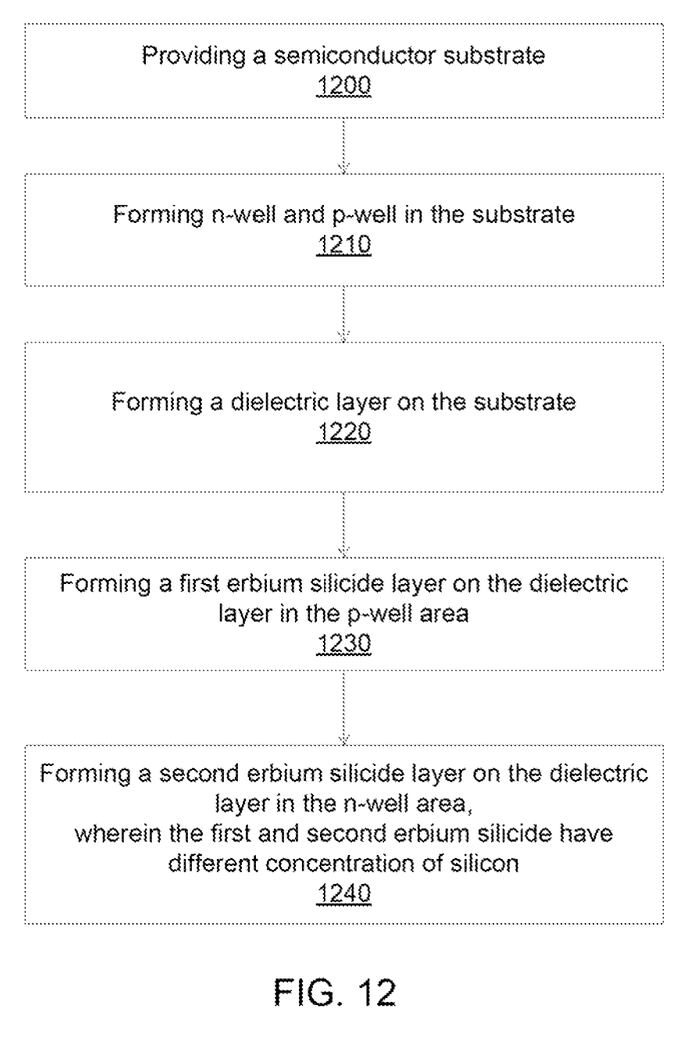
FIG. 12 illustrates a flow chart for forming a CMOS device having erbium silicide layers according to some embodiments.

FIG. 12 illustrates a flow chart for forming a CMOS device having erbium silicide layers according to some embodiments. In operation 1200, a substrate is provided. In operation 1210, n-well and p-well can be formed in the substrate. Alternatively, the substrate can be p-type, and only n-well can be formed on the p-type substrate. Or the substrate can be n-type, and only p-well can be formed. In operation 1220, a dielectric layer can be formed on the substrate. The dielectric layer can include a high dielectric constant material, such as $HfO_2$, $HfSi_xO_y$, $Al_2O_3$, or $ZrO_2$.

In operation 1230, a first erbium silicide layer can be formed on the dielectric layer in the p-well area. In operation 1230, a second erbium silicide layer can be formed on the dielectric layer in the n-well area. The first and second erbium silicide layers can have different silicon concentration. The silicon concentrations of the first and second erbium silicide layers can be selected to optimize the work function of the erbium silicide layers.

In some embodiments, the erbium silicide layers can be formed by depositing alternate sequences of silicon layers and erbium layers. The total thickness of the sequence can be less than 10 nm or less than 5 nm. Different sequences can be used. For example, the sequence can include one or more silicon layers and one or more erbium layers. The sequence can include one silicon layer and one erbium layer. The sequence can include multiple silicon layers and one erbium layer. The sequence can include one silicon layer and multiple erbium layers.

In some embodiments, the sequence can include depositing the silicon layer before depositing the erbium layer. The sequence can include depositing the erbium layer before depositing the silicon layer.

In some embodiments, the silicon and erbium layers can be deposited using a physical vapor deposition process. The erbium layer can be deposited using a physical vapor deposition using a direct current sputtering process at 50 W. The silicon layer can be formed using a physical vapor deposition using a radio frequency sputtering process at 50 W.

The sequence can be annealed so that erbium and silicon in the alternate sequence can react to form an erbium silicide layer. Other processes can be included, for example, source and drain regions can be formed on the substrate before forming the first layer. Metal interconnect can be formed after forming the erbium silicide layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method of forming a metal gate stack finFET device, the method comprising:
   providing a substrate;
   forming a first layer on the substrate over a channel region, wherein the first layer comprises a dielectric material;
   forming a multilayer above the first layer, wherein the multilayer comprises a second layer and a third layer, wherein the second layer comprises silicon, wherein the third layer comprises erbium; and
   annealing the second and third layers to form an erbium silicide layer,
      wherein the first layer and the erbium silicide layer form a metal gate stack;
   wherein the first layer and the erbium silicide layer surround the channel region on two sides;
   forming a source region and a drain region on the substrate at opposite ends of the metal gate stack,
      wherein the source region and the drain region are formed on the substrate before forming the first layer, and;
   doping the source region and the drain region,
      wherein the erbium silicide layer prevents doping of the channel region.

2. The method of claim 1, wherein the first layer comprises a high-k material.

3. The method of claim 1, wherein the multilayer comprises one or more second layers and one or more third layers.

4. The method of claim 1, wherein the multilayer comprises one second layer and one third layer.

5. The method of claim 1, wherein the multilayer comprises multiple second layers and one third layer.

6. The method of claim 1, wherein the multilayer comprises one second layer and multiple third layers.

7. The method of as in claim 1, wherein forming the multilayer comprises depositing the second layer before depositing the third layer.

8. The method of claim 1, wherein forming the second and third layers is performed using a physical vapor deposition process.

9. The method of claim 1, wherein forming the third layer comprises a physical vapor deposition using a direct current sputtering process at 1-2.5 W/cm2.

10. The method of claim 1, wherein forming the second layer comprises a physical vapor deposition using a radio frequency sputtering process at 1-2.5 W/cm2.

11. The method of claim 1, further comprising forming metal interconnects after forming the annealing the second and third layers.

12. The method of claim 9, wherein forming the third layer further comprises depositing erbium via direct current deposition for 2 seconds at 50 W power and 5 milliTorr pressure, wherein a target for depositing the erbium is between about 2-3 inches in diameter.

13. The method of claim 10, wherein forming the second layer further comprises depositing silicon via radio frequency sputtering for 5 seconds at 100 W power and 5 milliTorr pressure, wherein a target for depositing the silicon is between about 2-3 inches in diameter.

14. The method of claim 1, wherein annealing the second and third layers to form the erbium silicide layer comprises one of a furnace anneal, rapid thermal processing, or high temperature depositions subsequent to forming the multilayer.

15. The method of claim 2, wherein the first layer comprises $TiO_2$.

16. The method of claim 1, wherein the source region and the drain region are doped after the multilayer is formed.

17. The method of claim 1, wherein the erbium silicide layer comprises $ErSi_x$ and X is between 0 and 2.

18. The method of claim 17, wherein the erbium silicide layer comprises one of $ErSi_{0.25}$, $Er_4Si$, or $ErSi_2$.

19. The method of claim 18, wherein the erbium silicide layer comprises $Er_4Si$ formed by an alternating sequence of 5.84 nm or erbium and 0.96 nm of silicon.

20. The method of claim 18, wherein the erbium silicide layer can be sputtered from different elemental targets onto a same substrate.

* * * * *